(12) United States Patent
Kim

(10) Patent No.: US 7,015,747 B2
(45) Date of Patent: Mar. 21, 2006

(54) DEVICE FOR CONTROLLING A FREQUENCY RESPONSE BY SCALING AN IMPEDANCE

(75) Inventor: Jae-wan Kim, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/750,599

(22) Filed: Dec. 29, 2003

(65) Prior Publication Data

US 2004/0169532 A1    Sep. 2, 2004

(30) Foreign Application Priority Data

Feb. 28, 2003    (KR)    ...................... 10-2003-0012813

(51) Int. Cl.
   *H03B 1/00*    (2006.01)
(52) U.S. Cl. ........................ 327/552; 327/553; 327/311
(58) Field of Classification Search ........ 327/551–559, 327/311, 531, 532, 175; 333/172; 340/825.71
See application file for complete search history.

(56) References Cited

U.S. PATENT DOCUMENTS

| | | | | |
|---|---|---|---|---|
| 4,114,117 A | * | 9/1978 | Ford | 333/173 |
| 4,213,467 A | * | 7/1980 | Stulen et al. | 600/546 |
| 4,494,551 A | * | 1/1985 | Little, III et al. | 600/509 |
| 4,639,795 A | * | 1/1987 | Watanabe et al. | 360/62 |
| 5,345,119 A | * | 9/1994 | Khoury | 327/553 |
| 5,408,197 A | * | 4/1995 | Miyake | 330/129 |
| 5,463,346 A | * | 10/1995 | Brooks | 327/553 |
| 5,473,278 A | * | 12/1995 | Shibata | 327/552 |
| 5,563,573 A | | 10/1996 | Ng et al. | |
| 5,621,315 A | * | 4/1997 | Ikeuchi et al. | 324/207.12 |
| 5,923,028 A | * | 7/1999 | Turnbull et al. | 250/214 R |
| 5,942,935 A | * | 8/1999 | Okanobu | 327/553 |
| 6,420,927 B1 | * | 7/2002 | Tavares et al. | 327/554 |
| 6,504,409 B1 | * | 1/2003 | Laletin | 327/175 |
| 6,710,644 B1 | * | 3/2004 | Duncan et al. | 327/558 |
| 6,784,728 B1 | * | 8/2004 | Fischer | 327/554 |

* cited by examiner

*Primary Examiner*—Timothy P. Callahan
*Assistant Examiner*—Hai L. Nguyen
(74) *Attorney, Agent, or Firm*—F.Chau & Associates,LLC

(57) ABSTRACT

Provided is a device for controlling a frequency response by scaling an impedance. The device includes a filter and a duty ratio controller. The filter generates an output signal after removing a frequency from an input signal, and comprises a first impedance component and a switch. The switch, which is serially connected to the first impedance component, is switched on or off in response to a duty-controlled clock signal. The duty ratio controller receives a clock signal, controls a duty ratio of the clock signal, and generates the duty-controlled clock signal. The duty ratio controller comprises a flip-flop, which has a clock terminal that receives the clock signal, and a reset terminal, which receives a delayed signal obtained after delaying the clock signal by a time delay. The duty ratio controller further comprises a delay component that receives the clock signal, generates the delayed signal, and controls the time delay in response to a duty control signal.

17 Claims, 7 Drawing Sheets

DEVICE FOR CONTROLLING A FREQUENCY RESPONSE BY SCALING AN IMPEDANCE

BACKGROUND OF THE INVENTION

1. Technical Field

The present invention relates to a signal filtering device, and more particularly, to a device for controlling a frequency response using impedance scaling.

2. Discussion of the Related Art

In general, signal filtering devices having a particular frequency response include an impedance component such as a resistor, an inductor, or a capacitor. An impedance component having a high value is typically larger than an impedance component having a low value and can become burdensome to incorporate into an integrated circuit (IC). As a result, an impedance component having a high value typically increases product cost and causes high parasitic capacitance that may result in signal distortion or attenuation.

One such example of an IC using an impedance component having a high value (e.g., a high value resistor) is a direct current (DC) offset removal circuit, which can be found in direct conversion receivers used in mobile communication systems.

Since a DC offset may saturate a baseband output terminal in a direct conversion receiver, it should be removed by a high-pass filter, containing a resistor and a capacitor. In most cases, however, a signal received from a baseband output terminal has information at a frequency of about 0. Thus, the high-pass filter has a low cutoff frequency.

FIG. 1 illustrates a general first-order resistor-capacitor (RC) high-pass filter. In order for the high-pass filter to have a low cutoff frequency, the capacitor C1 and/or the resistor R1 must be large. The large sizes of the capacitor C1 and the resistor R1 increase the size of a semiconductor chip on which the general high-pass filter is located. The resulting large chip size is disadvantageous for at least two reasons: (1) integration problems resulting from its increased size; and (2) reduction in the received signal due to high parasitic capacitance at an output node of the high-pass filter.

FIG. 2 illustrates a general active RC low-pass filter. The frequency response of the low-pass filter of FIG. 2 can be changed by using two resistors R1, R2 and a capacitor C1. In order for the low-pass filter of FIG. 2 to obtain a desired frequency response, the resistors R1, R2 and the capacitor C1 should be maintained at desired levels. In general, a resistor's value and a capacitor's value change depending on a manufacturing process or temperature. In a semiconductor chip, for example, resistance changes 30–100% and capacitance changes 10–30% due to changes in the manufacturing process, pressure, and temperature. Thus, it is necessary to tune the resistance or the capacitance to obtain the desired frequency response from the filter. One example circuit that can be used to tune capacitance is shown in FIG. 3. As shown in FIG. 3, the capacitance of a capacitor is controlled by a capacitor array that can be switched.

As shown in FIG. 3, a plurality of capacitors C1l–C1n are connected in parallel with each other, and switches SW1–SWn, which are serially connected to the capacitors C1l–C1n, are switched on or off. Thus, enabling the capacitance of the circuit to be controlled via a switching operation. However, this method requires additional components such as the switches SW1–SWn and several control bits B1–Bn, which are used to control the switches SW1–SWn. As a result, the circuit becomes complex, and the tuning accuracy and the range of the capacitance are defined by the number of capacitors and control bits.

A common resistance and/or capacitance controlling circuit can become complex, thus making it difficult to control its frequency response. In addition, if the filter in a resistance and/or capacitance controlling circuit requires a high resistance or a plurality of capacitors, the IC on which the circuit is located increases in size.

Accordingly, there exists a need for a device that can easily control the frequency response of a circuit by scaling the impedance.

SUMMARY OF THE INVENTION

According to one aspect of the present invention, a device for controlling a frequency response comprises a filter and a duty controller. The filter generates an output signal after removing a frequency from an input signal, and comprises a first impedance component and a switch, wherein the switch is serially connected to the first impedance component and is switched on or off in response to a duty-controlled clock signal. The duty ratio controller receives a clock signal, controls a duty ratio of the clock signal, and generates a duty-controlled clock signal.

The duty ratio controller additionally comprises a flip-flop, which receives a delayed signal obtained after delaying the clock signal by a time delay and a delay component, wherein the delay component receives the clock signal, generates the delayed signal, and controls the time delay in response to a duty control signal.

The filter additionally comprises an amplifier, a second impedance component that is connected to one terminal of the amplifier and an output node of the filter and that is connected to an input node and an output node of the filter, and a third impedance component that is connected to the one terminal of the amplifier and an input node of the filter, wherein the first impedance component and the switch are serially connected between one terminal.

According to another aspect of the present invention, a device for controlling a frequency response comprises a filter and a duty ratio controller. The filter generates an output signal after removing a frequency from an input signal, and comprises an impedance component and a switch, wherein the switch is serially connected to the impedance component and is switched on or off by a duty-controlled clock signal. The duty ratio controller generates the duty-controlled clock signal. The frequency response of the filter varies in response to a duty ratio of the duty-controlled clock signal. The duty ratio controller also receives a clock signal and generates the duty-controlled clock signal in response to a duty control signal. The switch may additionally be positioned on a transmission path between an input node and an output node of the device when another transmission path exists between an input node and an output node of the device.

BRIEF DESCRIPTION OF THE DRAWINGS

The above aspects of the present invention will become more apparent by describing in detail exemplary embodiments thereof with reference to the attached drawings, in which.

DETAILED DESCRIPTION OF EXEMPLARY EMBODIMENTS

Figure 4:
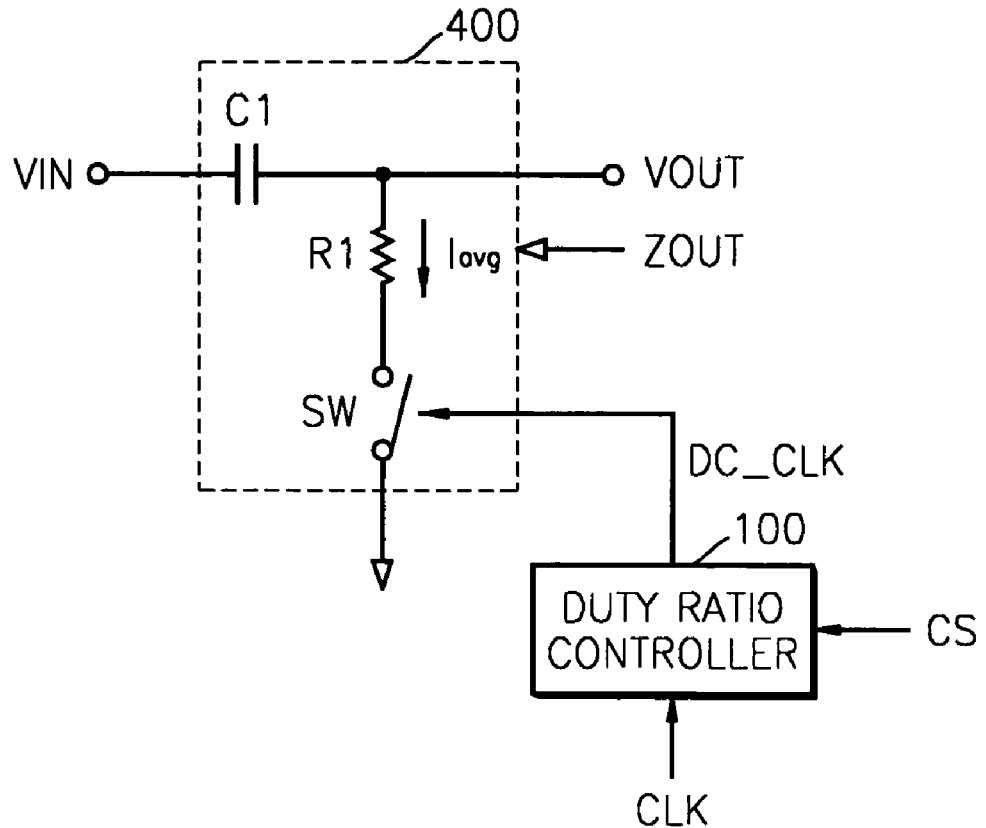
FIG. 4 illustrates a device for controlling a frequency response by scaling an impedance, according to an exemplary embodiment of the present invention.

FIG. 4 illustrates a device for controlling a frequency response by scaling an impedance, according to an exemplary embodiment of the present invention. Referring to FIG. 4, the device of FIG. 4 includes a duty ratio controller 100 and a filter 400.

Figure 5:
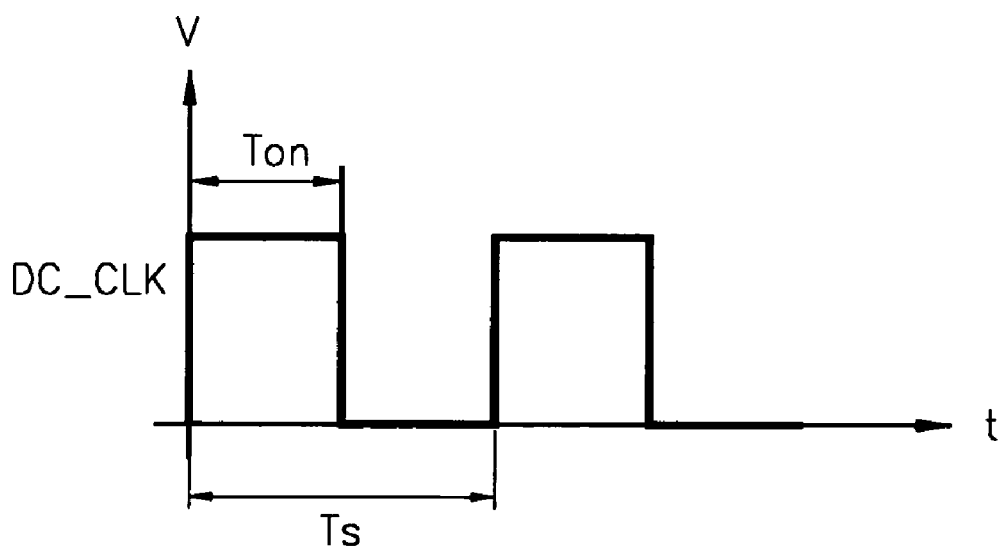
FIG. 5 illustrates a waveform of a duty-controlled clock signal DC_CLK.

The duty ratio controller 100 controls the duty ratio of a clock signal CLK in response to a duty control signal CS and generates a duty-controlled clock signal DC_CLK. In this embodiment, the clock signal CLK has a duty ratio of 50%. The clock signal CLK with a duty ratio of 50% is maintained at the same ratio from a high level state to a low level state. In other words, the rate of the clock signal CLK at a high level is 50%. FIG. 5 illustrates a waveform of the duty-controlled clock signal DC_CLK. Referring to FIG. 5, the duty ratio of the duty-controlled clock signal DC_CLK is defined by $T_{on}/T_s$. In FIG. 5, when $T_{on}$ is half of $T_s$, the duty ratio is 50%. The duty-controlled clock signal DC_CLK has a frequency that is at least double the band of an input signal.

The filter 400, as shown in FIG. 4, is a high-pass filter and includes a resistor R1, a capacitor C1, and a switch SW. The capacitor C1 is connected between an input voltage VIN node and an output voltage VOUT node. The resistor R1 and the switch SW are serially connected between the output voltage VOUT node and a ground voltage. The switch SW is switched on or off in response to the duty-controlled clock signal DC_CLK output from the duty ratio controller 100.

As shown in FIG. 4, the resistor R1 is serially connected to the switch SW, and the switch SW is switched on or off in response to the duty-controlled clock signal DC_CLK, thereby scaling an equivalent resistance ZOUT with respect to the output voltage VOUT node.

Figure 1:
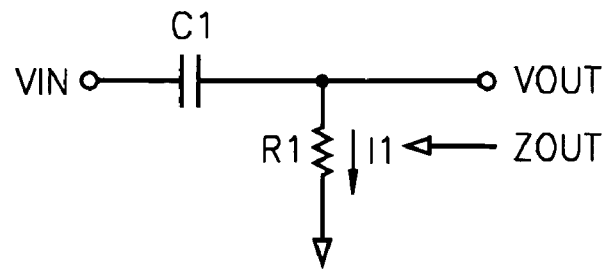
FIG. 1 illustrates a general first-order RC high-pass filter.
Figure 2:
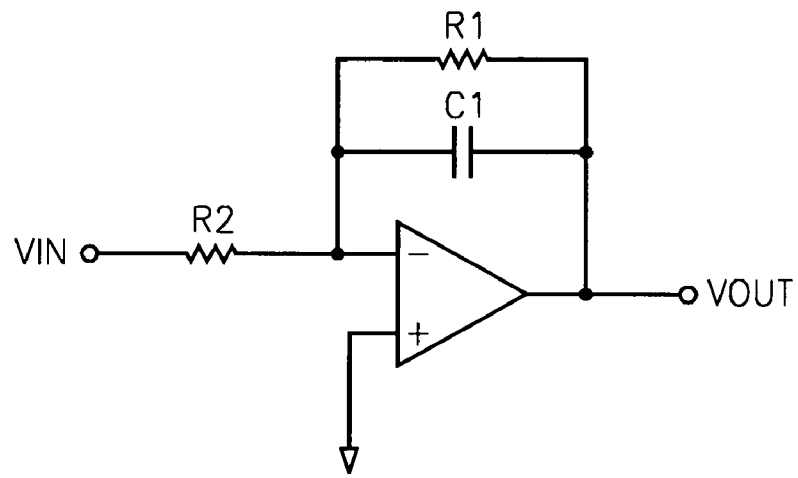
FIG. 2 illustrates a general active RC low-pass filter.
Figure 3:
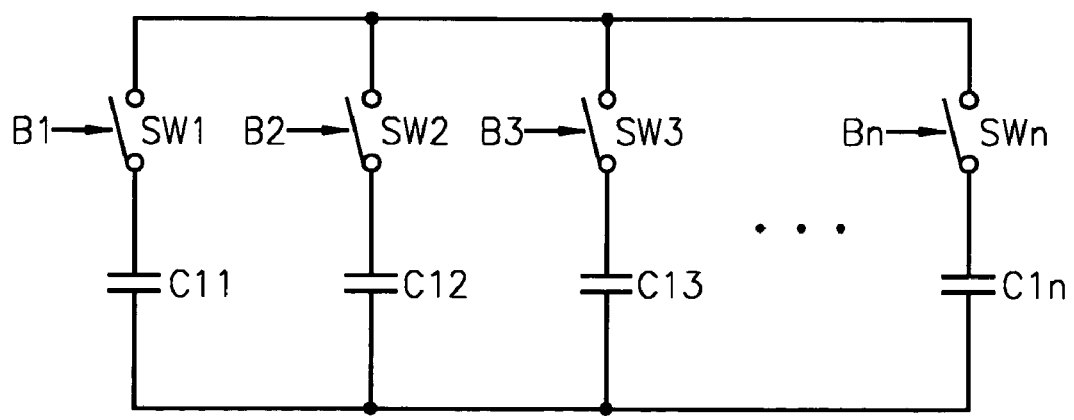
FIG. 3 illustrates a capacitor array that can be electrically switched.

As shown in FIG. 1, when a switch is not connected to the resistor R1, the equivalent resistance ZOUT is defined as follows.

$$ZOUT = \frac{VOUT}{I1}, \qquad (1)$$

where VOUT denotes an output voltage at an output node and I1 denotes a current flowing through the resistor R1.

Whereas, as shown in FIG. 4, when the switch SW is switched on or off in response to the duty-controlled clock signal DC_CLK, the equivalent resistance ZOUT is defined as follows.

$$ZOUT = \frac{VOUT}{I_{avg}} = \frac{VOUT}{I1\left(\frac{T_{on}}{T_s}\right)} = \frac{VOUT}{I1}\left(\frac{T_s}{T_{on}}\right) = R1\left(\frac{T_s}{T_{on}}\right), \qquad (2)$$

where VOUT denotes an output voltage at an output node, $I_{avg}$ denotes an average current flowing through the resistor R1, I1 denotes a current flowing through the resistor R1 when the switch SW is in an on state, and $T_{on}/T_s$ denotes a duty ratio of duty-controlled clock signal DC_CLK.

In FIG. 4, when the switch SW is in the on state, i.e., when the time is $T_{on}$, the current I1 flows through the resistor R1. When the switch is in an off state, the current does not flow through the resistor R1. Thus, the average current $I_{avg}$ is obtained by scaling the current I1 at a ratio of $T_{on}/T_s$. Hence, the equivalent resistance ZOUT, i.e., the impedance, can be changed by controlling the duty ratio ($T_{on}/T_s$) of the duty-controlled clock signal DC_CLK.

In FIG. 4, if the duty ratio ($T_{on/Ts}$) of the duty-controlled clock signal DC_CLK decreases, the equivalent resistance ZOUT increases. Thus, even if the resistor R1 has a low value, the equivalent resistance ZOUT can be high. Accordingly, the equivalent resistance ZOUT changes with the duty ratio of the duty-controlled clock signal DC_CLK, which enables control over the cutoff frequency of the filter 400.

The present invention, in which frequency characteristics of the filter 400 are controlled by scaling a resistance, will be verified by the following.

First, in FIG. 1, the capacitance of the capacitor C1 is set to 10 pF and the resistance of the resistor R1 is set to 10 kΩ. Then a cutoff frequency fc of the high-pass filter of FIG. 1 can be expressed as follows.

$$f_c = \frac{1}{2\pi \times R1 \times C1} = \frac{1}{2\pi \times 10k \times 10p} \cong 1.6 \text{ MHz.} \qquad (3)$$

Figure 6:
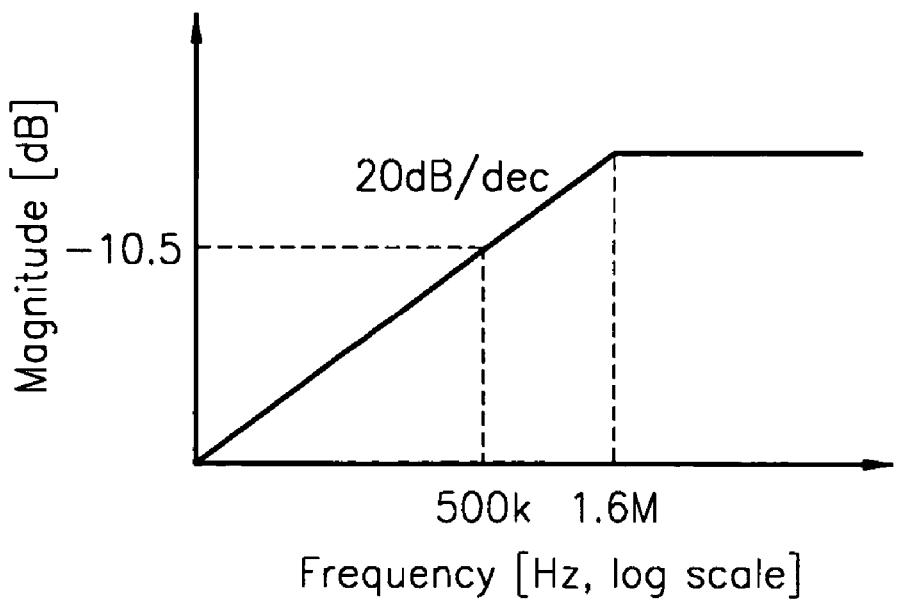
FIG. 6 is a bode plot of the frequency response of the general first-order RC high-pass filter of FIG. 1.

A bode plot of the frequency response of the general first-order RC high-pass filter of FIG. 1 is shown in FIG. 6. The magnitude response of the high-pass filter of FIG. 1 can be expressed as follows.

$$20\log|T(jw)| = 20\log\left[\frac{f}{f_c}\right] - 10\log\left[1 + \left(\frac{f}{f_c}\right)^2\right] \qquad (4)$$

$$20\log|T(j2\pi 500k)| = 20\log\left[\frac{500k}{1.6M}\right] - 10\log\left[1 + \left(\frac{500k}{1.6M}\right)^2\right]$$

Thus, when a sine wave of 500 kHz is input to the high-pass filter of FIG. 1, the magnitude of its output waveform is reduced to −10.5 dB.

On the other hand, in the high-pass filter 400 of FIG. 4, the capacitance of the capacitor C1 and the resistance of the resistor R1 are the same as the capacitance of the capacitor C1 and the resistor R1 of FIG. 1. It is assumed that the duty ratio of the duty-controlled clock signal DC_CLK is set to 10%, i.e., $T_{on}/T_s = 25n/250n = 1/10$. Then, the resistance of the resistor R1 of FIG. 4 is increased by 10 times the original value, thus, the cutoff frequency fc of the high-pass filter of FIG. 4 must be lowered to 160 kHz as follows.

$$f_c = \frac{1}{2\pi \times R1 \times \left[\frac{T_s}{T_{on}}\right] \times C1} = \frac{1}{2\pi \times 10k \times 10 \times 10p} \cong 160 \text{ kHz} \quad (5)$$

Thus, when the sine wave of 500 kHz is input to the high-pass filter of FIG. 4, the magnitude of the output waveform is reduced to 0.4 dB, in accordance with Equation 4. In other words, under identical conditions, the magnitude difference between the output waveforms of FIGS. 1 and 4 is expected to be approximately 10 dB.

Figure 7:
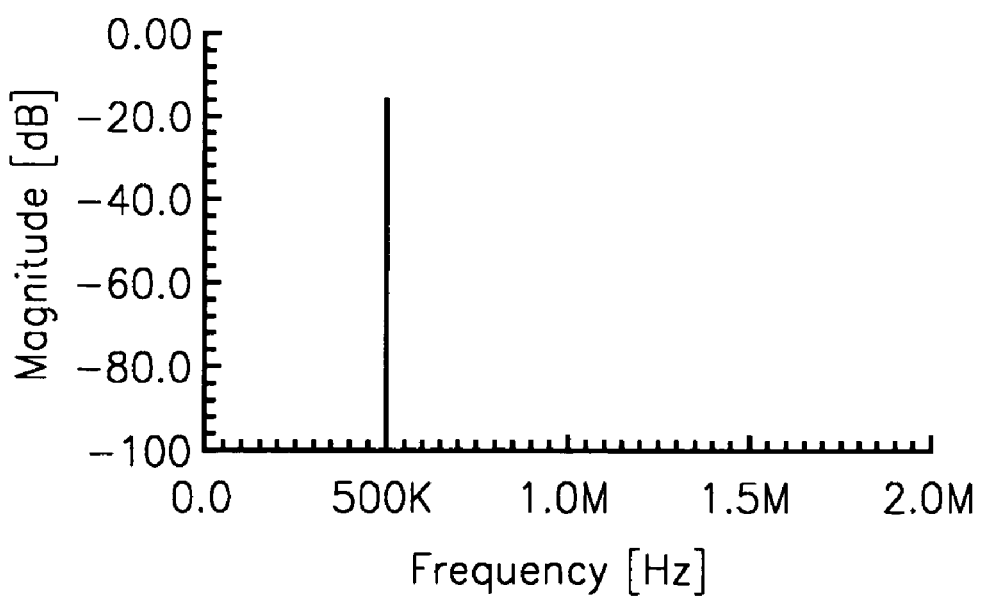
FIG. 7 illustrates the result obtained when the sine wave of 500 kHz is input to the general first-order high-pass filter of FIG. 1 and the output waveform is fast fourier transformed.
Figure 8:
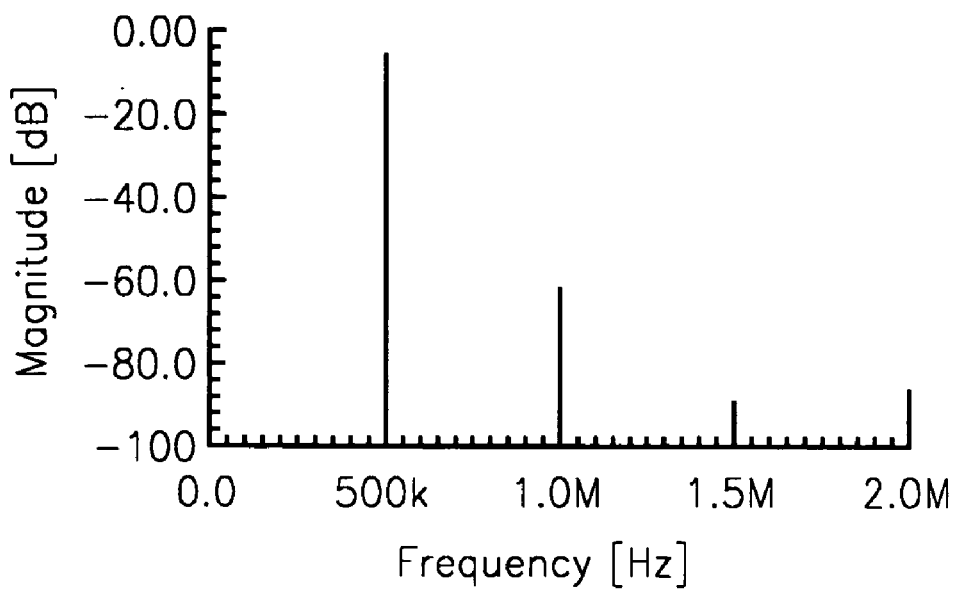
FIG. 8 illustrates the result obtained when the sine wave of 500 kHz is input to the general first-order high-pass filter of FIG. 4 and the output waveform is fast fourier transformed.

To confirm this expectation, the output waveforms are fast fourier transformed when the sine wave of 500 kHz is input to the high-pass filters of FIGS. 1 and 4. The results are shown in FIGS. 7 and 8. FIG. 7 illustrates the result obtained when the sine wave of 500 kHz is input to the high-pass filter of FIG. 1 and the output waveform is fast fourier transformed. FIG. 8 illustrates the result obtained when the sine wave of 500 kHz is input to the high-pass filter of FIG. 4 and the output waveform is fast fourier transformed. As shown in FIGS. 7 and 8, the x-axes represent the frequency, and the y-axes represent the magnitude of an output signal.

Figure 9:
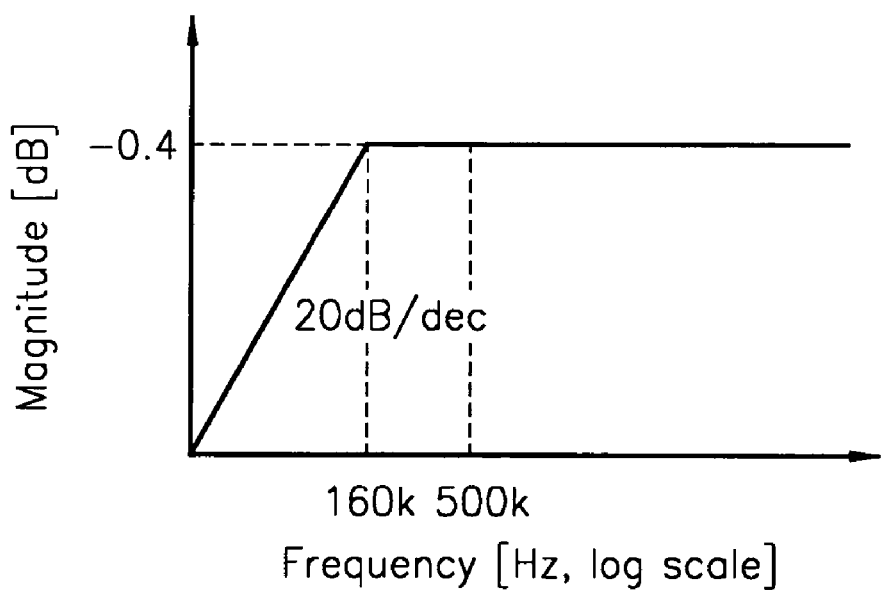
FIG. 9 illustrates the frequency response of the high-pass filter of FIG. 4.

As expected, the magnitude difference between the output signals of the high-pass filters of FIGS. 1 and 4 is 10 dB. Also, the resistance of the resistor R1 connected to the switch SW has been verified to scale to 10 times the original resistance. Thus, by scaling the impedance, the frequency response of FIG. 6 changes to that of FIG. 9. As shown in FIGS. 6 and 9, the cutoff frequency is reduced to 1/10 times the original cutoff frequency by scaling the impedance to 10 times the original impedance. FIG. 9 illustrates the frequency response of the high-pass filter of FIG. 4.

In the exemplary embodiment of the present invention as shown in FIG. 4, the frequency response is controlled by scaling the resistance, but the frequency response may also be controlled by scaling the impedance components such as the capacitor C1 or the resistor R1.

The high-pass filter 400 of FIG. 4 may generate the harmonics as shown in FIG. 8 since the switch SW of FIG. 4 is a MOS transistor manufactured by a 0.18 μm process.

Figure 13:
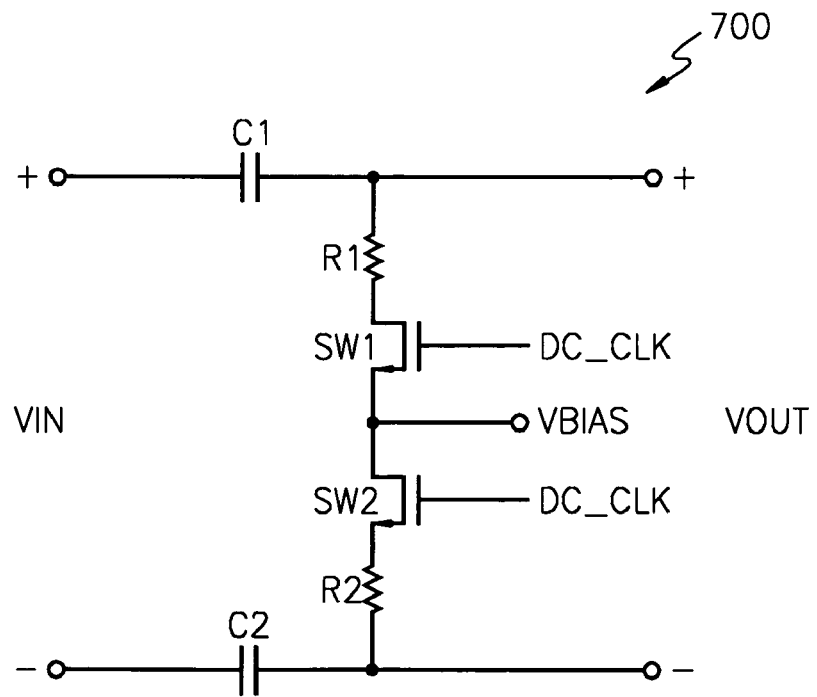
FIG. 13 illustrates a device for controlling a frequency response by scaling an impedance, according to an alternative exemplary embodiment of the present invention.

When using the MOS transistor as the switch SW, a transfer function non-linearly changes in response to an output voltage and time, thus, generating harmonics as shown in FIG. 8. In order to reduce the harmonics, the high-pass filter of FIG. 4 can be configured as a fully differential circuit as shown in FIG. 13. The exemplary embodiment of FIG. 13 will be described later.

Figure 10:
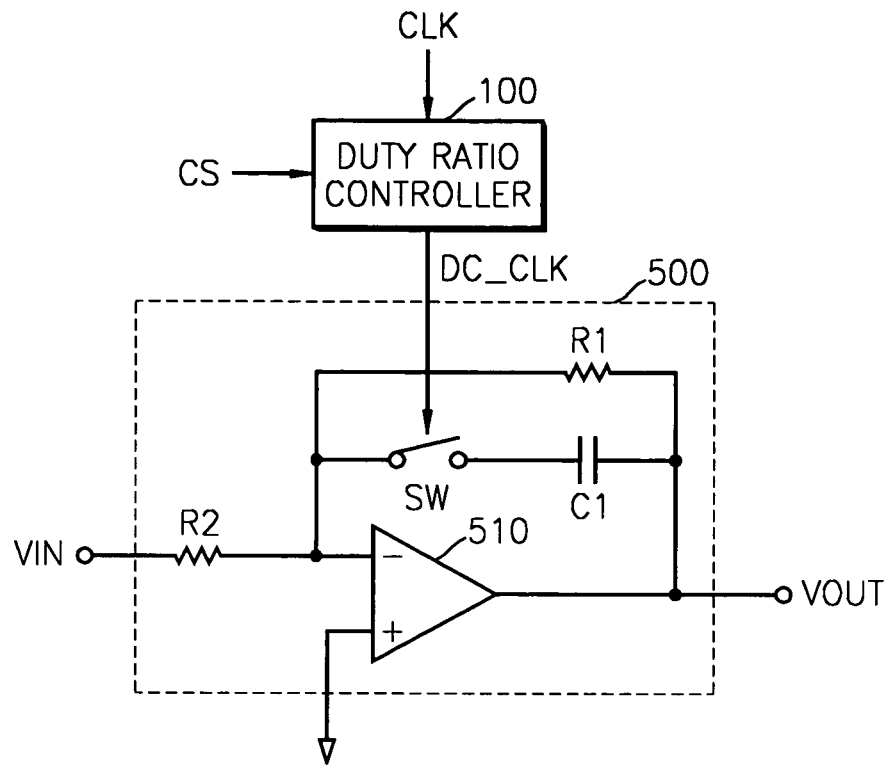
FIG. 10 illustrates a device for controlling a frequency response by scaling an impedance, according to another exemplary embodiment of the present invention.

FIG. 10 illustrates a device for controlling a frequency response by scaling an impedance, according to another exemplary embodiment of the present invention. Referring to FIG. 10, the device includes a duty ratio controller 100 and a filter 500.

The duty ratio controller 100 is equivalent to the duty ratio controller 100 of FIG. 4 and will not be described in detail here.

The filter 500 is a low-pass filter and includes a first and second resistor R1, R2, a capacitor C1, a switch SW, and an amplifier 510. An input voltage VIN is input to a negative terminal of the amplifier 510 via the second resistor R2. The capacitor C1 and the switch SW are serially connected between the negative terminal of the amplifier 510 and the output voltage VOUT node. The first resistor R1 is connected in parallel to the capacitor C1 and the switch SW. The switch SW is switched on or off in response to the duty-controlled clock signal DC_CLK output from the duty ratio controller 100.

In the exemplary embodiment of the present invention shown in FIG. 10, the switch SW is serially connected to the capacitor C1. Thus, the entire capacitance is scaled, which changes the frequency response of the filter 500.

Figure 11:
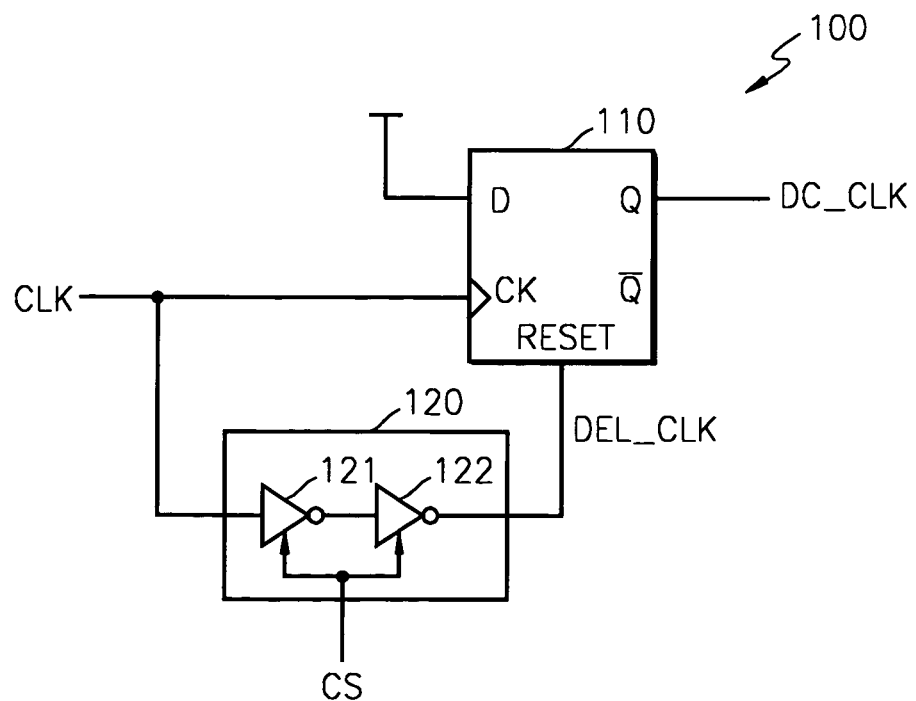
FIG. 11 is a circuit diagram of a duty ratio controller.

FIG. 11 is a circuit diagram of the duty ratio controller 100 as shown in FIGS. 4 and 10. Referring to FIG. 11, the duty ratio controller 100 includes a flip-flop 110 and a delay component 120. The clock signal CLK is input to a clock terminal CK of the flip-flop 110. A delayed clock signal DEL_CLK, which is obtained by delaying the clock signal CLK by a predetermined time delay, is input to a reset terminal RESET of the flip-flop 110. A supply voltage is connected to an input terminal D of the flip-flop 110. The delay component 120 delays the clock signal CLK by a predetermined time delay in response to the duty control signal CS. The delay component 120 of FIG. 11 includes two inverters 121, 122. The duty control signal CS controls the time delay introduced by the inverters 121, 122. Thus, the duty ratio of the duty-controlled clock signal DC_CLK, output from an output terminal Q of the flip-flop 110, is determined by the time delay introduced by the inverters 121, 122. The time delay introduced by the inverters 121, 122 can be controlled by controlling the supply voltage applied to the inverters 121, 122 or by controlling the current flowing through the inverters 121, 122.

Figure 12:
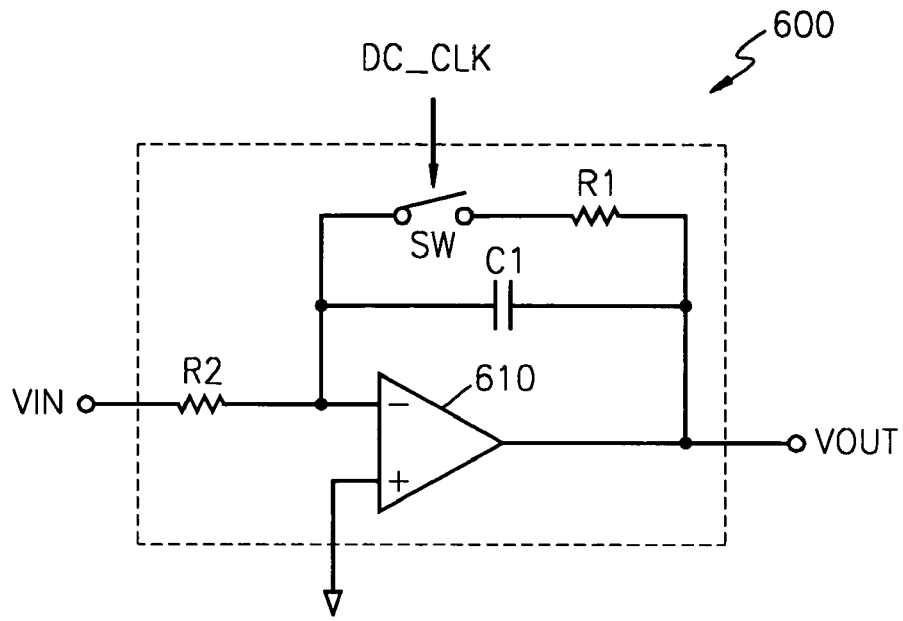
FIG. 12 illustrates a device for controlling a frequency response by scaling an impedance, according to yet another exemplary embodiment of the present invention.

FIG. 12 illustrates a device for controlling a frequency response by scaling an impedance, according to yet another exemplary embodiment of the present invention. The device of FIG. 12 includes a duty ratio controller 100 (refer to FIG. 10) and a filter 600. The duty ratio controller 100 is equivalent to that of FIG. 10 and is not illustrated in FIG. 12 and will not be described in detail here. The filter 600 is similar to the filter 500 of FIG. 10, but is different from the filter 500 of FIG. 10 in that the switch SW is not serially connected to the capacitor C1, but serially connected to the resistor R1.

In other words, the resistor R1 and the switch SW are serially connected between the negative terminal of the amplifier 610 and the output voltage VOUT node. The capacitor C1 is connected in parallel to the resistor R1 and the switch SW. Thus, the entire resistance can be scaled, which changes the frequency response of the filter 600 as described in the exemplary embodiment of FIG. 4. In the exemplary embodiment of FIG. 10, a gain of the filter 500 is fixed and only the cutoff frequency is controlled. In contrast, in the exemplary embodiment of FIG. 12, the gain of the filter 600 can also be controlled.

FIG. 13 illustrates a device for controlling frequency response by scaling an impedance, according to an alternative exemplary embodiment of the present invention. The device includes the duty ratio controller 100 (refer to FIG. 10) and a filter 700. The duty ratio controller 100 is equivalent to that of FIG. 10 and will not be described here.

The filter 700 is a low-pass filter and includes a first and second resistor R1, R2, a first and second capacitor C1, C2, and a first and second switches SW1, SW2. The first capacitor C1 is connected between a positive input node and a positive output node. The second capacitor C2 is connected between a negative input node and a negative output node. The first resistor R1 and the first switch SW1 are serially connected between the positive output node and a bias voltage VBIAS node. The second resistor R2 and the second switch SW2 are serially connected between the negative output node and the bias voltage VBIAS node.

The input voltage VIN is applied to the negative input nodes and output as the output voltage VOUT through the positive output node. A bias voltage VBIAS applied to the bias voltage VBIAS node biases the output voltage VOUT. The duty-controlled clock signal DC_CLK is applied to the first switch SW1 and the second switch SW2. The first switch SW1 and the second switch SW2 are MOS transistors.

The device of FIG. 13 controls the frequency response by scaling the entire resistance in the same manner as the device of FIG. 10.

Figure 14:
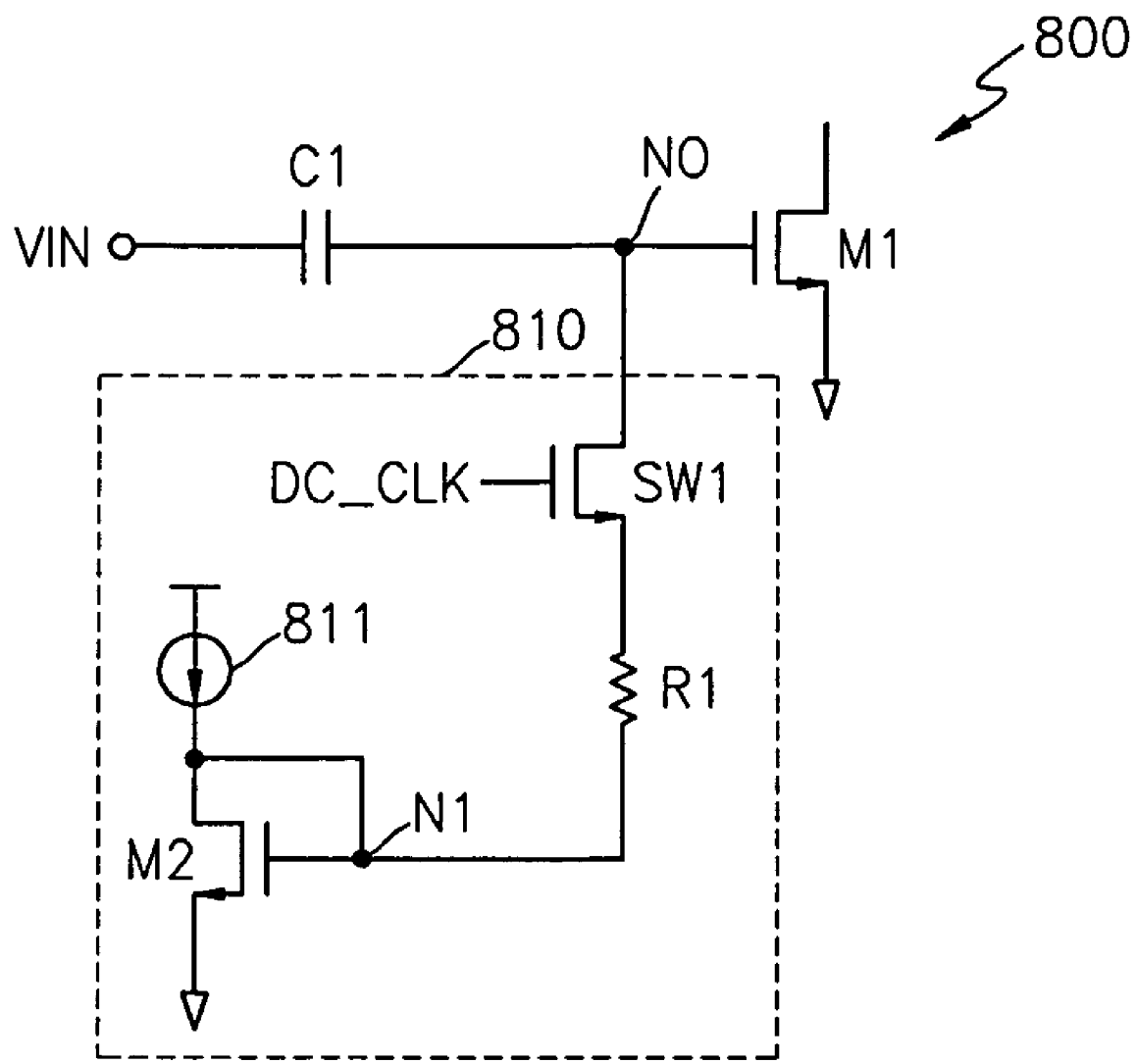
FIG. 14 illustrates a device for controlling a frequency response by scaling an impedance, according to another alternative exemplary embodiment of the present invention.

FIG. 14 illustrates a device for controlling a frequency response by scaling an impedance, according to another alternative exemplary embodiment of the present invention. The device of FIG. 14 includes the duty ratio controller 100 (refer to FIG. 10) and an AC coupling circuit 800. The duty ratio controller 100 is equivalent to that of FIG. 10 and will not be described here.

The AC coupling circuit 800 removes the DC of an input signal VIN, which is provided to an input node, transmits the AC at a level higher than a predetermined cutoff frequency to an output node NO, and biases the output node NO at a predetermined DC voltage level. The AC coupling circuit 800 includes an AC coupling capacitor C1 and a bias circuit 810. The bias circuit 810 includes a switch SW1, a resistor R1, a current source 811, and a MOS transistor M2. The switch SW1 is serially connected to the resistor R1 and scales the resistance of the resistor R1.

A gate and a drain of the MOS transistor M2 are connected to each other, and the MOS transistor M2 acts as a diode. The DC voltage at a gate node N1 of the MOS transistor M2 is determined by a current flowing through the MOS transistor M2. The gate of the MOS transistor M2 is connected to the output node NO via the resistor R1 and the switch SW1. Thus, the DC voltage at the output node NO is determined by the DC voltage at the gate node N1 of the MOS transistor M2.

In FIG. 14, if a resistor with low resistance is used, instead of the resistor R1 and the switch SW1, and the input signal VIN is transferred to the gate of a MOS transistor M1, a large amount of signal loss occurs in the input signal VIN. This is because the input signal VIN is transferred to the bias circuit 810. In order to reduce loss in the input signal VIN, the bias circuit 810 should have a high resistance. However, a high resistance results in high parasitic capacitance and a large chip size. These problems can be solved by connecting the resistor R1 to the switch and scaling the resistance to a large value. In addition, frequency characteristics can be controlled by scaling the resistance, thereby allowing transmission of an input signal at a low frequency.

The switch SW1, which is serially connected to an impedance component, e.g., R1, is composed of a MOS transistor with sufficient off resistance. If the off resistance is small, current leakage increases and a quantity of nonlinear change in the resistance, caused by the output voltage, increases, which causes an increase in harmonics. The duty ratio of the duty controlled clock signal DC_CLK is sufficiently small so that the harmonics of the output signal are below a predetermined level. As the duty ratio of the duty controlled clock signal DC_CLK increases, the harmonics of the output signal decrease. This is because the transmission characteristics of the MOS transistor change nonlinearly with the output signal when the switch is in the on state. Thus, if the amount of time, corresponding to when the switch is in the on state, decreases, the harmonics also decrease in proportion to the decrease in the amount of time.

When only one transmission path exists between an input node and an output node, the switch that is serially connected to the impedance component is configured so that it is not positioned on the transmission path. In other words, the switch should be positioned on a transmission path other than the transmission path between the input node and output node, which is used for controlling frequency response. But, when another transmission path exists between the input node and the output node of the device, the switch is positioned on the transmission path between the input node and the output node of the device. Thus, when the input node and output node of the device are connected by a transmission path, the switch may be positioned on another transmission path between the input node and the output node of the device. These arrangements are made because when the input signal is transmitted to the output node of the device via the switch, a continuous signal changes into a discrete signal.

As described above, it is possible to scale a small impedance component to a large impedance component by controlling the duty ratio of a clock that is applied to a switch connected to the small impedance component. In other words, it is possible to easily achieve a large impedance in a chip by controlling the duty ratio of the clock signal. In addition, the impedance varying with the manufacturing process or temperature can be scaled. Thus, the frequency response of the circuit with the impedance component can be controlled to a desired frequency response.

Moreover, according to the present invention, since the impedance is determined by a duty ratio of a clock signal in a chip, error in the impedance can be reduced. The programming performance of the device for controlling frequency response, according to the present invention, is superior to a conventional device for controlling frequency response. Accordingly, the frequency response of the circuit with the impedance component can be easily controlled using impedance scaling.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A device for controlling a frequency response comprising:
   a filter, wherein the filter generates an output signal after removing a frequency from an input signal, the filter comprising a first impedance component and a switch that is connected to the first impedance component, wherein the switch is switched on or off in response to a duty-controlled clock signal; and
   a duty ratio controller, wherein the duty ratio controller receives a clock signal and a duty control signal for selectively adjusting the duty-controlled clock signal, controls a duty ratio of the clock signal, and generates the duty-controlled clock signal;

wherein the duty ratio controller comprises: a flip-flop that receives a delayed signal after obtaining the clock signal by a time delay; and a delay component that receives the clock signal, generates the delayed signal, and controls the time delay in response to the duty control signal.

2. The device of claim 1, wherein the delay component comprises:

a first inverter that receives the clock signal and the duty control signal and outputs a first inverted clock signal; and a second inverter that receives the first inverted clock signal the duty control signal and outputs a second inverted clock signal as the delayed signal in response to the duty control signal.

3. The device of clam 1, wherein the output signal is generated after removing the frequency at a predetermined band from the input signal.

4. The device of claim 1, wherein the switch is positioned on a transmission path between an input node and an output node of the device when another transmission path exists between an input node and an output node of the device.

5. The device of claim 1, wherein the first impedance component and the switch are serially connected between an output node and a voltage node of the filter.

6. The device of claim 5, wherein the filter further comprises:

a second impedance component that is connected to an input node and an output node of the filter.

7. The device of claim 1, wherein the filter further comprises:

an amplifier;

a second impedance component that is connected to one terminal of the amplifier and an output node of the filter; and a third impedance component that is connected to the one terminal of the amplifier and an input node of the filter, wherein the first impedance component and the switch are serially connected between one terminal of the amplifier and the output node of the filter.

8. The device of claim 7, wherein the first impedance component is a capacitor, and the second and third impedance components are resistors.

9. The device of claim 7, wherein the first and third impedance components are resistors, and the second impedance component is a capacitor.

10. The device of claim 1, wherein the duty ratio of the duty-controlled clock signal is controlled in response to the duty control signal.

11. The device of claim 1, wherein the switch is a MOS transistor.

12. The device of claim 1, wherein the switch is positioned in a transmission path.

13. A device for controlling a frequency response comprising:

a filter, wherein the filter generates an output signal after removing a frequency from an input signal, the filter comprising: an impedance component and a switch that is connected to the impedance component, wherein the switch is switched on or off by a duty-controlled clock signal; and a duty ratio controller, wherein the duty ratio controller receives a clock signal and a duty control signal for selectively adjusting the duty-controlled clock signal and generates the duty-controlled clock signal, wherein a frequency response of the filter varies in response to a duty ratio of the duty-controlled clock signals, wherein the duty ratio controller comprises: a flip-flop that receives a delayed signal after obtaining the clock signal by a time delay; and a delay component that receives the clock signal, generates the delayed signal, and controls the time delay in response to the duty control signal.

14. The device of claim 13, wherein the output signal is generated after removing the frequency at a predetermined band from the input signal.

15. The device of claim 13, wherein the switch is positioned on a transmission path between an input node and an output node of the device when another transmission path exists between an input node and an output node of the device.

16. The device of claim 13, wherein the switch is positioned on a transmission path.

17. The device of claim 13, wherein the duty ratio controller generates the duty-controlled clock signal in response to the duty control signal.

* * * * *